(12) United States Patent
Cox et al.

(10) Patent No.: US 11,653,461 B2
(45) Date of Patent: May 16, 2023

(54) SYSTEMS AND METHODS FOR MODULAR CABINET CABLE PASS-THROUGH

(71) Applicant: JPMORGAN CHASE BANK, N.A., New York, NY (US)

(72) Inventors: Jacob Cox, Littleton, CO (US); Sheridan Wendt, Lakewood, CO (US); Robert S. Newnam, Wilmington, DE (US)

(73) Assignee: JPMORGAN CHASE BANK, N.A., New York, NY (US)

( * ) Notice: Subject to any disclaimer, the term of this patent is extended or adjusted under 35 U.S.C. 154(b) by 119 days.

(21) Appl. No.: 17/376,952

(22) Filed: Jul. 15, 2021

(65) Prior Publication Data

US 2021/0345505 A1    Nov. 4, 2021

Related U.S. Application Data

(63) Continuation of application No. 16/854,587, filed on Apr. 21, 2020, now Pat. No. 11,109,498.

(51) Int. Cl.
*H05K 5/02* (2006.01)
*H05K 7/14* (2006.01)

(52) U.S. Cl.
CPC ......... *H05K 5/0247* (2013.01); *H05K 5/0213* (2013.01); *H05K 5/0256* (2013.01); *H05K 7/1487* (2013.01); *H05K 7/1491* (2013.01)

(58) Field of Classification Search
None
See application file for complete search history.

(56) References Cited

U.S. PATENT DOCUMENTS

| | | | |
|---|---|---|---|
| 6,315,249 B1 | 11/2001 | Jensen et al. | |
| 6,580,603 B1 * | 6/2003 | Resnick | G06F 1/184 |
| | | | 312/223.1 |
| 9,229,496 B2 * | 1/2016 | Cravens | G06F 1/187 |
| 9,532,480 B2 * | 12/2016 | Shen | G06F 1/184 |
| 9,867,307 B2 * | 1/2018 | Kurosaki | H05K 7/1487 |
| 9,936,613 B2 | 4/2018 | Adiletta et al. | |
| 9,955,607 B1 * | 4/2018 | Valentine | H05K 7/1488 |
| 10,098,249 B2 | 10/2018 | Adams | |
| 10,834,843 B1 | 11/2020 | Erie et al. | |
| 10,863,646 B1 | 12/2020 | Rampey et al. | |
| 10,952,345 B2 | 3/2021 | Gupta et al. | |
| 11,178,787 B2 * | 11/2021 | Peng | H05K 5/0247 |
| 2003/0223199 A1 * | 12/2003 | Smith | G06F 1/181 |
| | | | 312/223.1 |

(Continued)

*Primary Examiner* — Xanthia C Cunningham
(74) *Attorney, Agent, or Firm* — Greenberg Traurig LLP

(57) ABSTRACT

Systems and methods for modular cabinet cable pass through are disclosed. A system may include a first lead modular plate having a U-shape and a first and a second follower modular plate, each of the first and the second follower modular plates having a U-shape and having a first follower modular plate leg and a second follower modular plate leg and a second plate portion therebetween, the second follower modular plate leg being longer than the first follower modular plates leg, and a bottom plate that receives at least a portion of the first lead modular plate, and the second follower modular plate legs of the first and the second follower modular plates. At least one cable may pass between an opening defined by the bottom plate and one of the first follower plate and the second follower plate.

18 Claims, 8 Drawing Sheets

(56) References Cited

U.S. PATENT DOCUMENTS

| | | | | |
|---|---|---|---|---|
| 2004/0057216 A1* | 3/2004 | Smith | ................... | G06F 1/3203 |
| | | | | 361/724 |
| 2005/0265013 A1* | 12/2005 | Keith | .................... | H04Q 1/023 |
| | | | | 361/826 |
| 2006/0250766 A1* | 11/2006 | Blaalid | ................... | G06F 1/187 |
| | | | | 361/679.33 |
| 2009/0273896 A1* | 11/2009 | Walker | ................... | G06F 1/187 |
| | | | | 361/679.33 |
| 2013/0003317 A1* | 1/2013 | Gong | ................... | H01R 13/72 |
| | | | | 361/826 |
| 2013/0214658 A1* | 8/2013 | Liang | .................. | H05K 7/1491 |
| | | | | 312/223.2 |
| 2015/0342080 A1* | 11/2015 | Chen | ................... | H05K 7/1487 |
| | | | | 361/679.31 |
| 2016/0011391 A1 | 1/2016 | Urbano et al. | | |
| 2016/0135322 A1* | 5/2016 | Chen | ................. | H05K 7/20727 |
| | | | | 361/679.46 |
| 2017/0082815 A1 | 3/2017 | Takeuchi et al. | | |

\* cited by examiner

SYSTEMS AND METHODS FOR MODULAR CABINET CABLE PASS-THROUGH

RELATED APPLICATIONS

This application claims priority to, and the benefit of, U.S. patent application Ser. No. 16/854,587, now U.S. Pat. No. 11,109,498, filed Apr. 21, 2020, the disclosure of which is hereby incorporated, by reference, in its entirety.

BACKGROUND OF THE INVENTION

1. Field of the Invention

The present disclosure generally relates to systems and methods for modular cabinet cable pass through.

2. Description of the Related Art

Data centers include many equipment cabinets. The equipment mounted within those cabinets must have access to cables, such as power cables, data cables, etc. As cables are routed in the data center environment, efforts are made to separate copper, power, and fiber cabling in order to protect the signals being sent, and to protect the physical cabling. Cabinet openings that allow these cables to be routed through the cabinets lead to "bypass air"—unintended air that leaks between contained hot and cold environments leading to a reduction of static pressure. Bypass air increases operational costs of data centers and reduces the overall efficiency of HVAC systems.

One existing solution is to use brushes to reduce the amount of bypass air leaving a cabinet, but this does not segregate cabling, and is not an effective means of significantly reducing the loss of static pressure. Another existing solution involves cutting rubber grommets to accommodate the quantity of cabling intended to be used, but typically this solution is more difficult to use and material cannot be added back to the grommet as cabling is removed.

SUMMARY OF THE INVENTION

Systems and methods for modular cabinet cable pass through are disclosed. In one embodiment, a modular cabinet cable pass through system may include a first lead modular plate having a U-shape and comprising a first lead modular plate leg, a second lead modular plate leg, and a first plate portion therebetween, the first lead modular plate leg and the second lead modular plate leg having substantially the same length; a first and a second follower modular plate, each of the first and the second follower modular plates having a U-shape and having a first follower modular plate leg and a second follower modular plate leg and a second plate portion therebetween, the second follower modular plate leg being longer than the first follower modular plates leg; and a bottom plate that receives at least a portion of the first plate portion of the first lead modular plate, and the second follower modular plate legs of the first and the second follower modular plates, the first follower modular plate legs of the first follower modular plate and the second follower modular plate being received by the first plate portion of the first lead modular plate. At least one cable may pass between an opening defined by the bottom plate and one of the first follower plate and the second follower plate.

In one embodiment, the system may further include a top plate that is in contact with at least a portion of each of the second plate portions of the first and second follower modular plates. The top plate may be secured to the bottom plate using a fastener.

In one embodiment, the first plate may be provided in an opening in an equipment cabinet.

In one embodiment, the system may further include a second lead modular plate and a third and a fourth follower modular plate, wherein the bottom plate receives at least a portion of the first plate portion of the second lead modular plate and the second follower modular plate legs of the third and fourth follower modular plate, the first follower modular plate legs of the third and fourth follower modular plates being received by the first plate portion of the second lead modular plate.

In one embodiment, the opening may be between the first or the second follower modular plate, and the third or the fourth follower modular plates, and wherein the cable passes through the opening.

In one embodiment, first plate portion and/or the second plate portions may include scallops on a surface thereon. The scallops may include convex portion on a first surface and a concave portion on a second surface.

In one embodiment, the system may further include a flow restrictor positioned in the opening.

In one embodiment, ends of the first leg portions, the second leg portions, the third leg portions, and the fourth leg portions may be configured to interface with one of the scalloped surfaces.

In one embodiment, a size of the opening may be adjustable by moving the first follower plate and/or the second follower plate in contact with the first lead plate.

According to another embodiment, a method for providing a modular cabinet cable pass through may include: (1) positioning, on a bottom plate, a first lead modular plate having a U-shape such that a portion of the first plate portion of the first lead modular plate may be in contact with the bottom plate and a first lead modular plate leg and a second lead modular plate leg of the first lead modular plate extend away from the bottom plate; (2) positioning a first follower modular plate having a U-shape such that a first follower modular plate leg of the first follower modular plate interfaces with the first plate portion of the first lead modular plate, and a second follower modular plate leg of the first follower plate interfaces with the bottom plate; (3) positioning a second follower modular plate having a U-shape such that a second follower modular plate leg of the second follower modular plate interfaces with the first plate portion of the first lead modular plate, and a second follower modular plate leg of the second follower plate interfaces with the bottom plate; and (4) adjusting a position of the one of the first follower modular plate and the second follower modular plate relative to the first lead modular plate and the bottom plate to define an opening. The opening may be sized to receive a cable passing through the cabinet.

In one embodiment, the method may further include positioning a top plate over the first follower plate, the first lead plate, and the second follower plate such that the top plate may be in contact with at least a portion of each of a second plate portions of the first and second follower modular plates. The top plate may be secured to the bottom plate using a fastener.

In one embodiment, the first plate may be provided in an opening in an equipment cabinet.

In one embodiment, the method may further include providing a second lead modular plate on the bottom plate, the second lead modular plate adjacent to the first lead modular plate, wherein the bottom plate receives at least a portion of the first plate portion of the second lead modular plate; and providing a third follower modular plate and a fourth follower modular plate, wherein first follower modular plate legs of the third and fourth follower modular plates are received by the first plate portion of the second lead modular plate, and second follower modular plate legs of the third follower modular plate and the fourth follower modular plate interface with the bottom plate.

In one embodiment, the opening may be between the first or the second follower modular plate, and the third or the fourth follower modular plates, and wherein the cable passes through the opening.

In one embodiment, the first plate portion and/or the second plate portions may include scallops on a surface thereof, wherein the scallops comprise a convex portion on a first surface and/or a concave portion on a second surface.

In one embodiment, the method may further include providing a flow restrictor in the opening.

In one embodiment, a size of the opening may be adjustable by moving the first follower plate and/or the second follower plate in contact with the first lead plate.

BRIEF DESCRIPTION OF THE DRAWINGS

In order to facilitate a fuller understanding of the present invention, reference is now made to the attached drawings. The drawings should not be construed as limiting the present invention but are intended only to illustrate different aspects and embodiments.

DETAILED DESCRIPTION OF PREFERRED EMBODIMENTS

Embodiments are generally directed to systems and methods for modular cabinet cable pass through. Embodiments provide a barrier to bypass air by maintaining a rigid structure, and also permits clean segregation of different cable types.

Embodiments may further include brushes to provide additional barriers to bypass air.

Embodiments may use interlocking C-shaped panels that slide within a larger frame. When the frame is secured (e.g., tightened down), or the interlocking panels are restricted in another manner (e.g., by a set screw), the panels may no longer move.

In embodiments, additional channels may be added, existing channels may be removed, the width of the channels may be adjusted, etc. as is necessary and/or desired.

Figure 1:
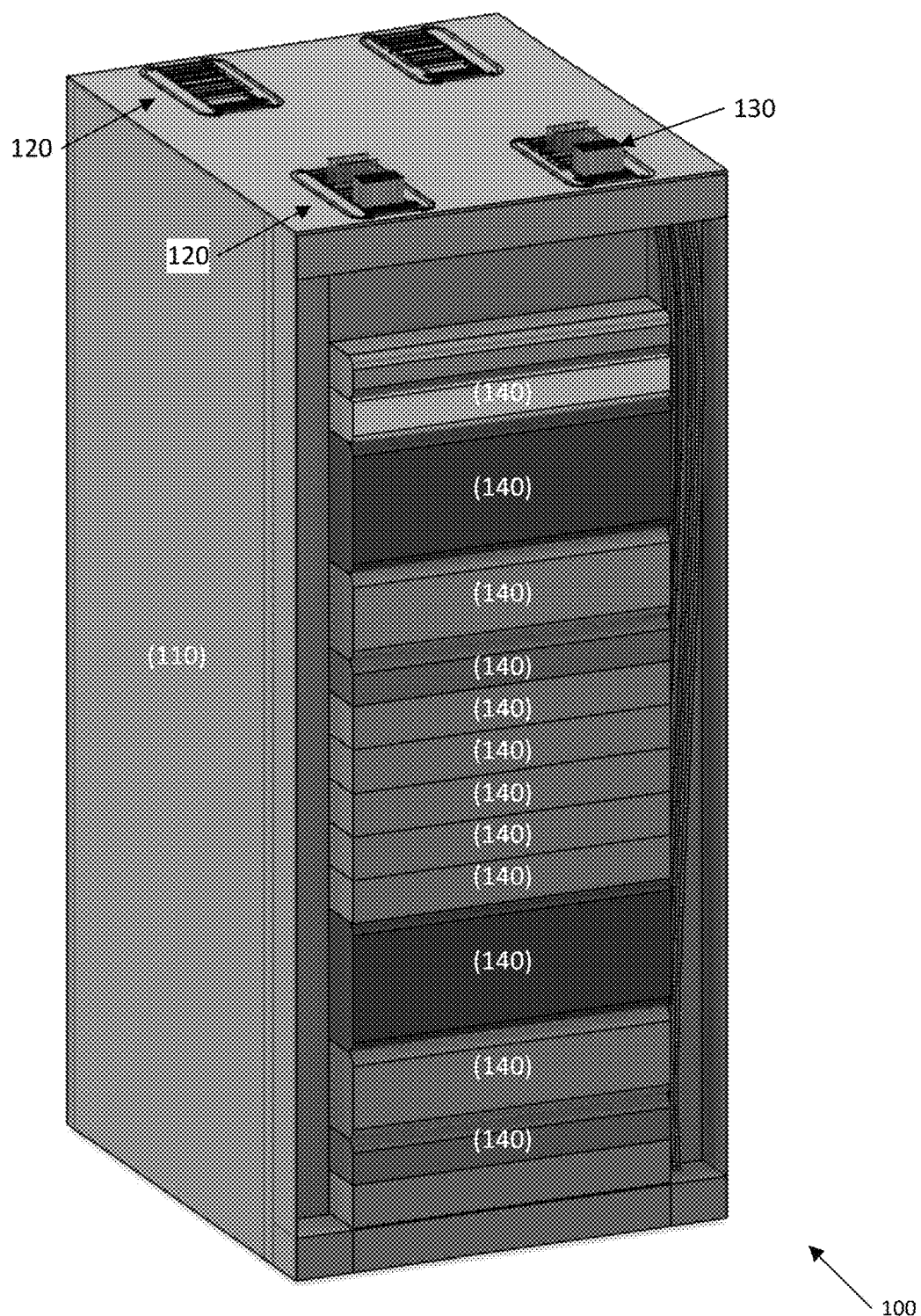
FIG. 1 depicts a perspective view of a system for modular cabinet cable pass through according to one embodiment.

Referring to FIG. 1, a system of a modular cabinet cable pass through is depicted according to one embodiment. System 100 may include cabinet 110, which may be any type of cabinet that may hold electronic equipment 140. Electronic equipment 140 may include any electronic equipment that may require a corded connection for power and/or data. Examples of electronic equipment 140 include servers, switches, storage, etc.

On one surface, such as a horizontal surface (e.g., top or bottom surface) or a vertical surface (e.g., side or back surface) may include one or more modular cabinet cable pass through devices 120. Modular cabinet cable pass through devices 120 permit cabling (e.g., power, data, etc.) to pass through an opening in cabinet 110 to access electronic equipment 140.

Figure 2:
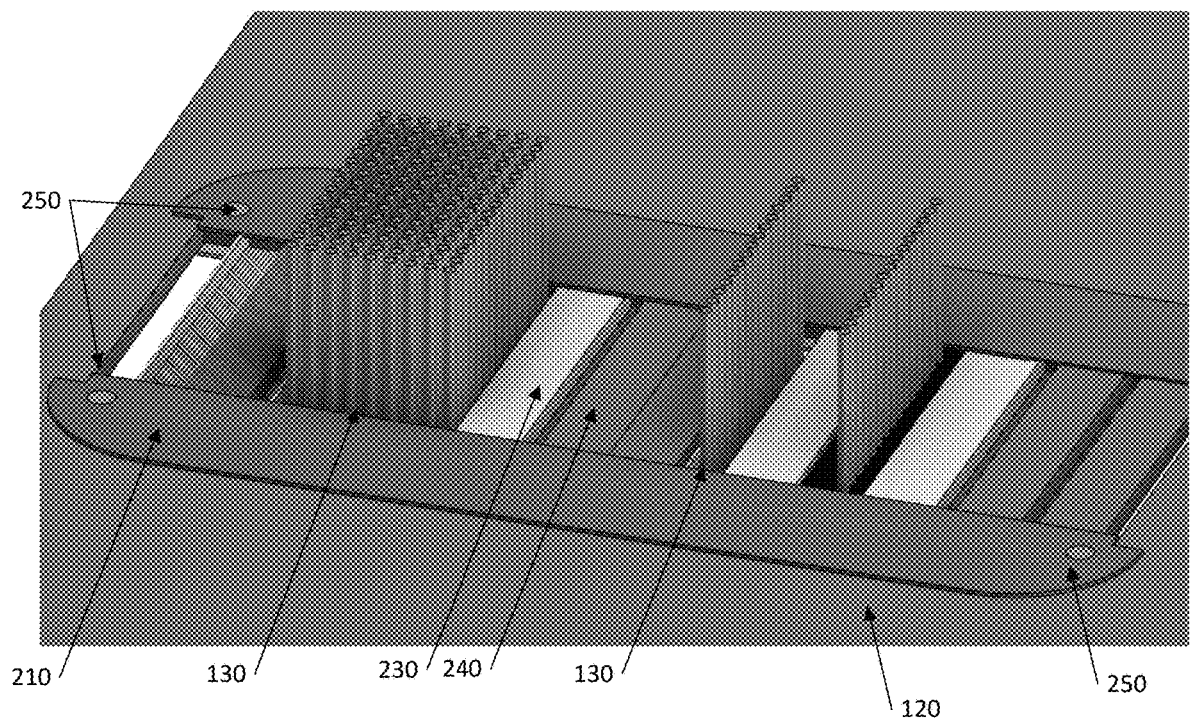
FIG. 2 depicts a top view of a system for modular cabinet cable pass through according to one embodiment.
Figure 3:
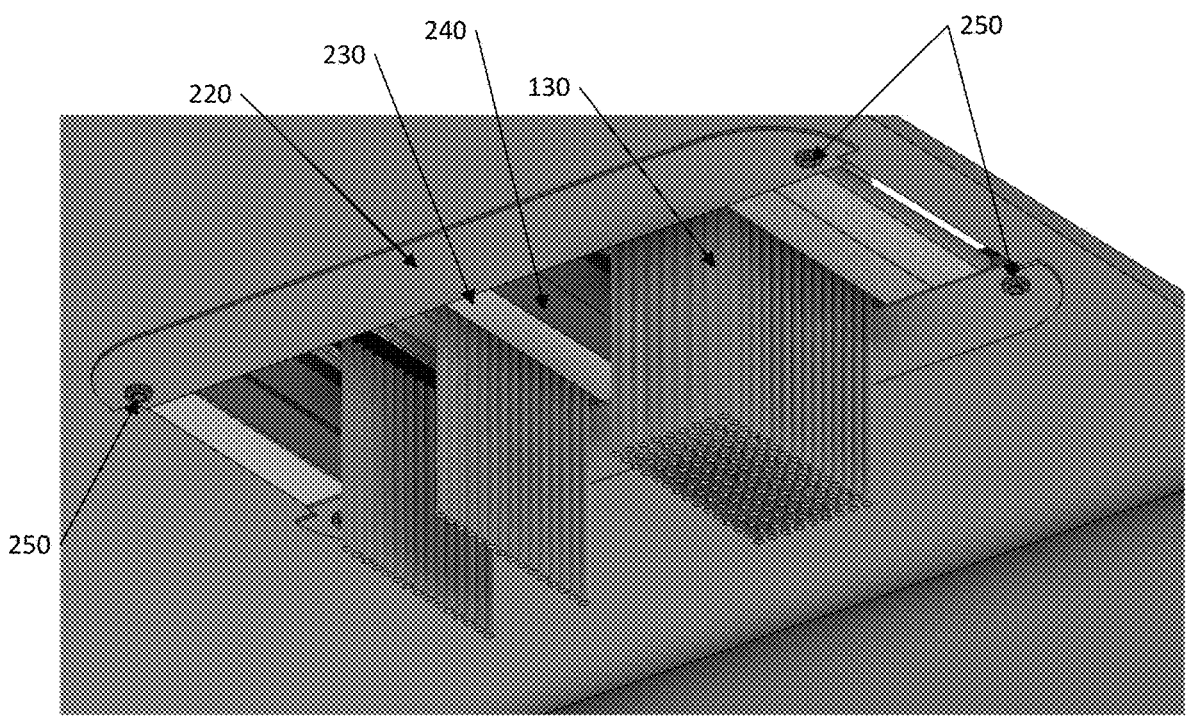
FIG. 3 depicts a bottom view of a system for modular cabinet cable pass through according to one embodiment.

Referring to FIGS. 2 and 3, a top view and a bottom view of a modular cabinet cable pass through device are provided, respectively, according to one embodiment. Modular cabinet cable pass through device 120 may include a plurality top plates 210 and bottom plates 220. Bottom plate 220 may support modular devices, including lead modular plate 230 and follower modular plate 240. Top plate 210 may be positioned over bottom plate 220 and secured with securing mechanisms 250, such as screws, bolts with nuts, pins, clips, etc. Any suitable securing mechanism 250 may be used as is necessary and/or desired.

Figure 4A:
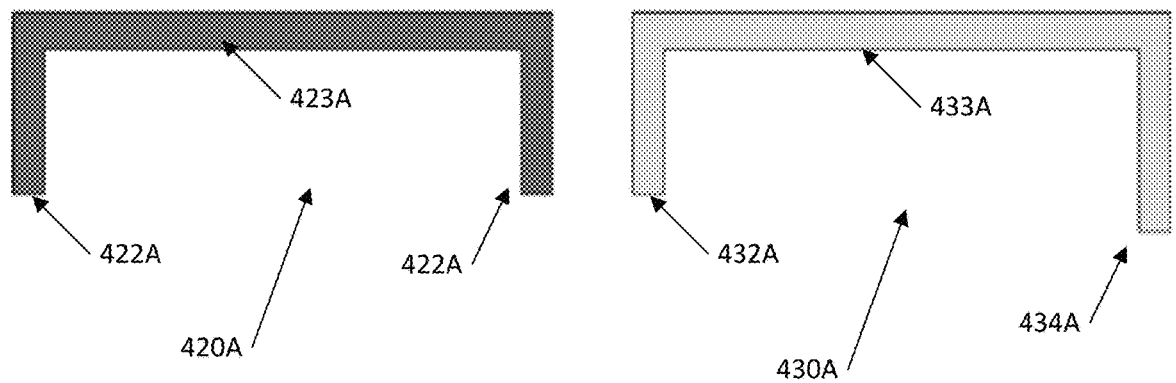
FIGS. 4A-4C depict exemplary lead modular plates and follower modular plates according to embodiments.
Figure 4B:
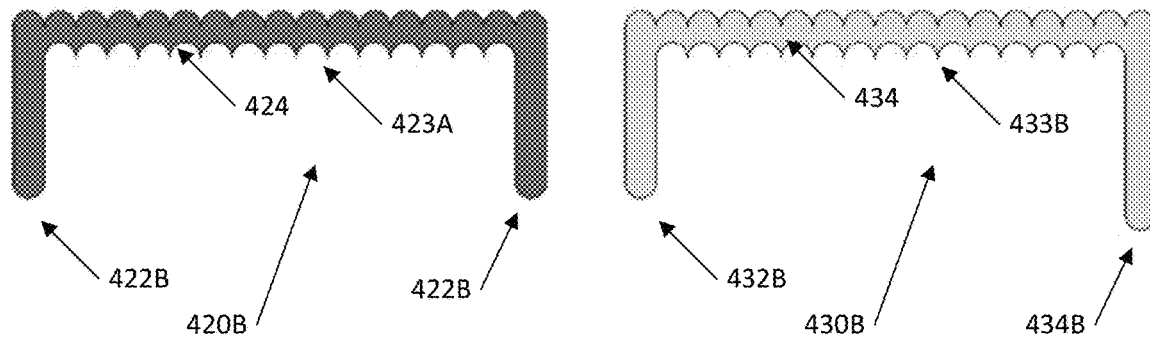
Figure 4C:
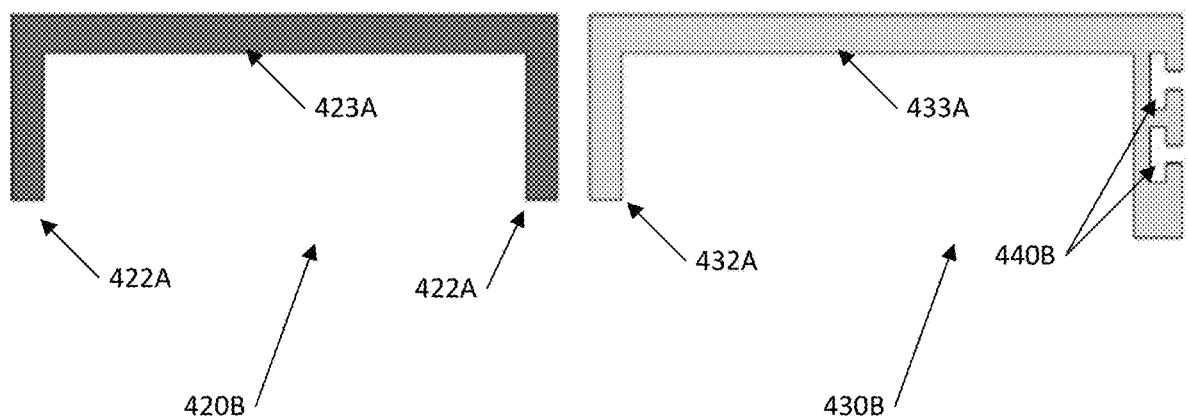

Referring to FIGS. 4A-4C, side views of lead modular plates and follower modular plates are provided according to one embodiment. In FIG. 4A, lead modular plate 420A includes legs 422A and plate portion 423A. Legs 422A of lead modular plate 422A have the same length.

Follower modular plate 430A includes legs 432A and 434A, and plate portion 433A. Legs 422A of lead modular plate 422A have the different lengths. For example, leg 434A is longer than leg 432A. Leg 432A is intended to interact with the bottom plate of a modular cabinet cable pass through device (not shown). Leg 422A and 432A may interact with plate portion 423A of lead modular plate 420A or plate portion 433A of follower modular plate 430A.

Referring to FIG. 4C, lead modular plate 420C is substantially similar to lead modular plate 420A, and follower modular plate 430C is substantially similar to follower modular plate 430A. Lead modular plate 420C and/or follower modular plate 430C may include scallops 424, 434 on plate portions 423C and 433C, respectively. Scallops 424 may be concave on one surface of portions 423C and 433C, and convex on the other surface of portions 423C and 433C.

Figure 5:
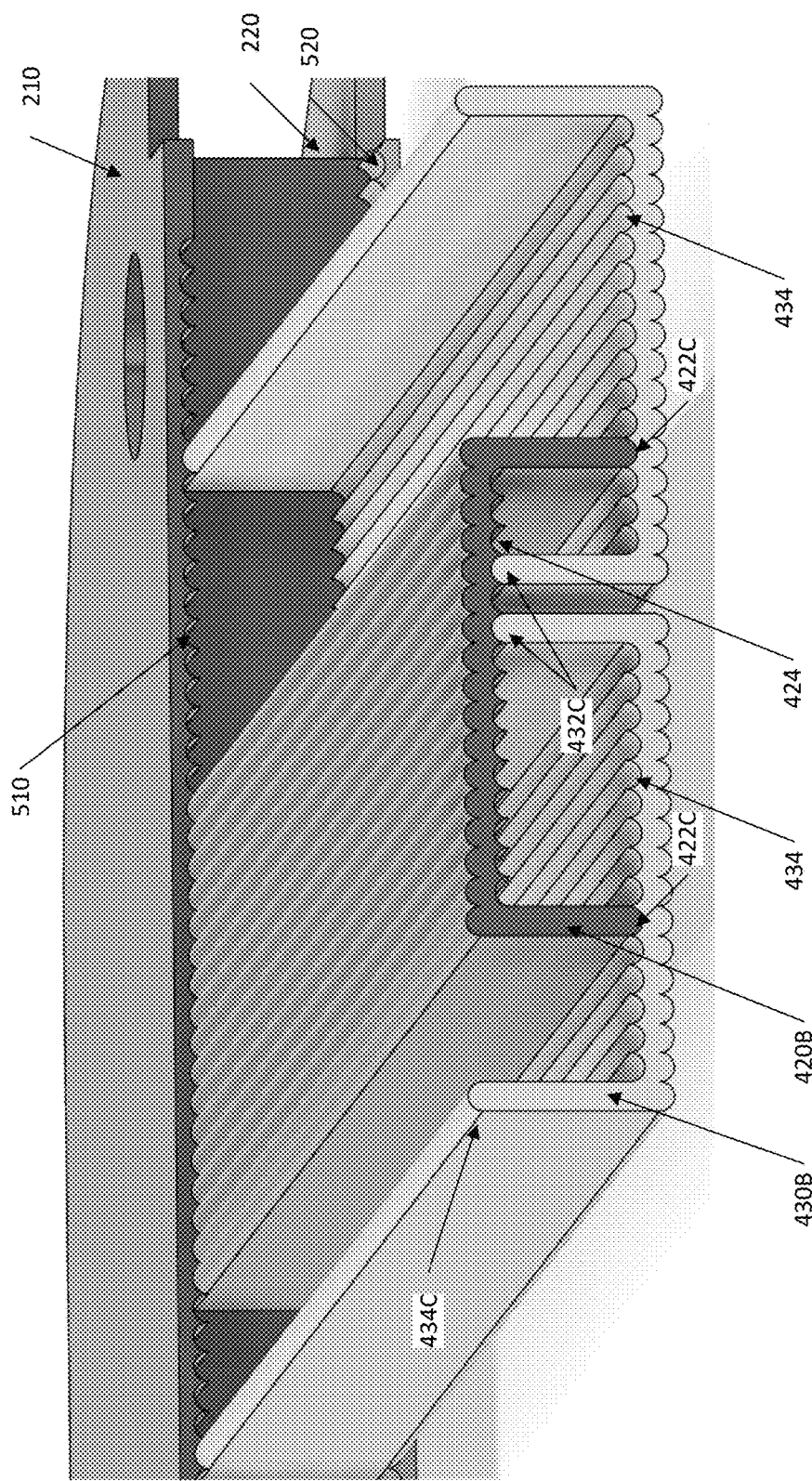
FIG. 5 depicts a side view of a system for modular cabinet cable pass through according to one embodiment.

In one embodiment, legs 422C, 432C, and 434C may be rounded to interact with scallops 424, 434 as illustrated in FIG. 5.

In addition, as illustrated in FIG. 5, top plate 210 and/or bottom plate 220 may include scallops 510 and 520, respectively. Scallops 510 and 520 may be concave, and may be provided to maintain the position of lead modular plate 420B and follower modular plate 430B relative to each other.

Although scallops are illustrated in FIG. 4B, it should be recognized that any suitable mechanism for maintain the positions of lead modular plate 420B, follower modular plate 430B, top plate 210, and bottom plate 220 may be used, including other geometries (e.g., grooves, etc.), fasteners (e.g., hook and loop fasteners), roughened surfaces, etc.

In one embodiment, some or all of the scallops may be optional, and a scalloped plate may be used with a non-scalloped plate.

Figure 6:
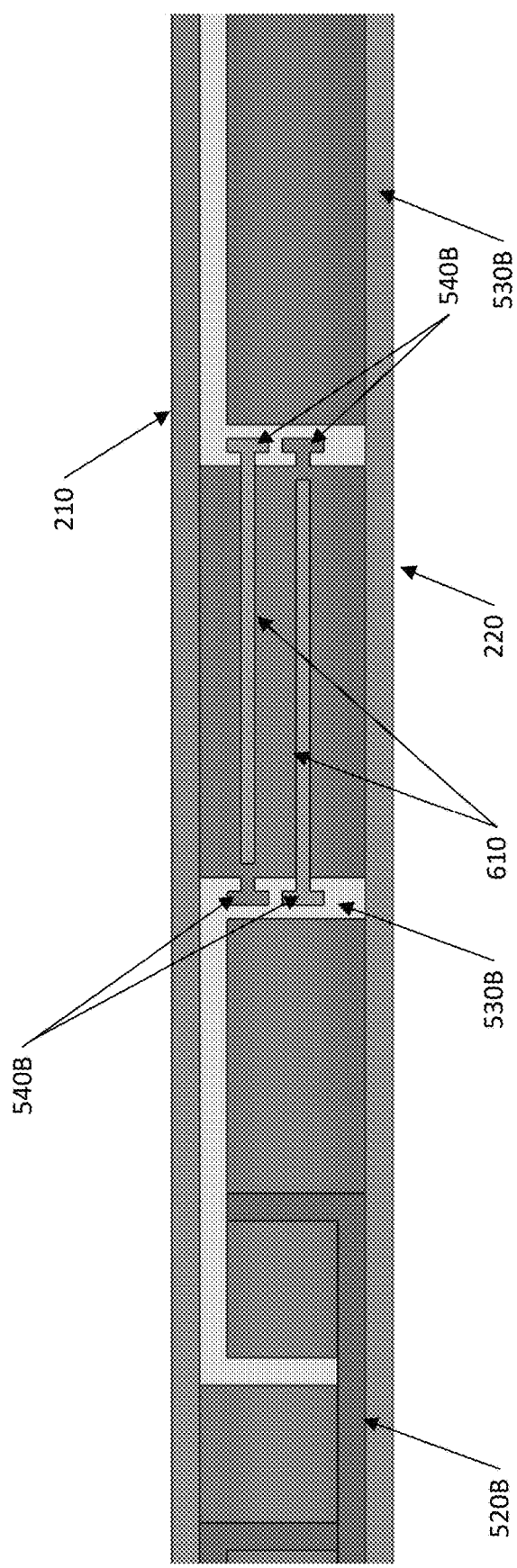
FIG. 6 depicts a side view of a system for modular cabinet cable pass through according to one embodiment.

Referring to FIG. 4C, lead modular plate 420C is substantially similar to lead modular plate 420A. Follower modular plate 430C is substantially similar to follower modular plate 430A, and may include one or more openings 440C that may receive a flow restrictor (not shown) such as a brush, a plate, a foam insert, hook and loop mounting positions, etc. that may restrict airflow in an opening. An example of such is provided in FIG. 6, wherein a plurality of flow restrictors 610 are provided.

Figure 7:
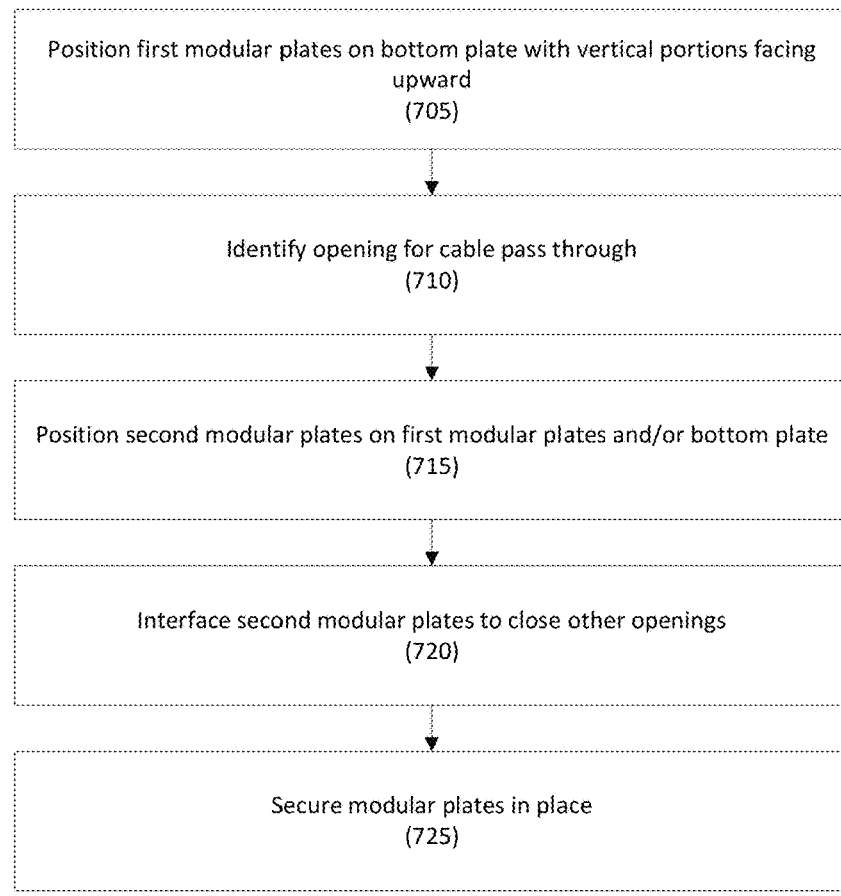
FIG. 7 depicts a method for modular cabinet cable pass through according to one embodiment.

Referring to FIG. 7, a method for modular cabinet cable pass through is provided according to one embodiment.

In step 705, a plurality of first modular plates may be positioned on a bottom plate in an opening in a surface of an equipment cabinet. In one embodiment, the first modular plates may be positioned so that their vertical portions are facing upward on a horizontal surface, or outward on a vertical surface.

In one embodiment, the first modular plates may be lead modular plates.

In one embodiment, matching scallops may be provided on a surface of the first modular plate and the bottom plate.

The first modular plates positioned in step 705 may all have vertical portions, or legs, having the same lengths.

In step 710, one or more opening for cable pass-through may be identified. The first modular plates may then be arranged to position the opening between them.

In step 715, one or more second modular plates may be positioned on the first modular plates with their vertical portions, or legs, facing the first modular plates. In one embodiment, the second modular plate that is adjacent to the opening may be a follower modular plate, and may a leg for interfacing with the first modular plate, and a second leg for interfacing with the bottom plate.

In one embodiment, if the legs of the second modular plate is being positioned on two first modular plates, the second modular plate may be a lead modular plate.

In one embodiment, the vertical portions of the second modular plates may interface with scallops in the first modular plate and/or the bottom plate.

In step 720, the second modular plates may be positioned to optimize the size of the opening for cable pass-through. In one embodiment, this may mean minimizing the size of the opening.

In one embodiment, additional flow restriction devices, such as brushes, plates, etc. may be provided to minimize the flow of air out for the equipment cabinet.

In step 725, the modular plates may be secured in place below a top plate. In one embodiment, a top plate may be provided and secured with set screws, clamps, bolts, hook-and-loop fasteners, combinations thereof, etc. may be used to secure the modular opening restrictors in place.

It should be recognized that although several different embodiments are disclosed, these embodiments are not exclusive. Thus, although certain features may be disclosed in the context of one embodiment, the features may be used any embodiment as is necessary and/or desired.

It will be readily understood by those persons skilled in the art that the present embodiments are susceptible to broad utility and application. Many embodiments and adaptations other than those herein described, as well as many variations, modifications and equivalent arrangements, will be apparent from or reasonably suggested by the present embodiments and foregoing description thereof, without departing from the substance or scope of the invention.

Accordingly, while the present exemplary embodiments have been described here in detail, it is to be understood that this disclosure is only illustrative and exemplary and is made to provide an enabling disclosure of the invention. Accordingly, the foregoing disclosure is not intended to be construed or to limit the present embodiments or otherwise to exclude any other such embodiments, adaptations, variations, modifications or equivalent arrangements.

What is claimed is:

1. A modular cabinet cable pass through system, comprising:
    a top modular plate having a U-shape and comprising a first top modular plate leg, a second top modular plate leg, and a top plate portion therebetween, the second top modular plate leg being longer than the first top modular plate leg;
    a bottom modular plate having a U-shape and having a first bottom modular plate leg, a second bottom modular plate leg, and a bottom plate portion therebetween, the second bottom modular plate leg being longer than the first bottom modular plate leg; and
    a cabinet comprising a bottom plate that receives at least a portion of the bottom plate portion and the second top modular plate leg, the first top modular plate leg received by the bottom plate portion and the first bottom modular leg received by the top plate portion;
    wherein at least one cable passes between an opening defined by the bottom plate and the top modular plate or the bottom modular plate.

2. The modular cabinet cable pass through system of claim 1, further comprising a top plate that is in contact with at least a portion of the top plate portion.

3. The modular cabinet cable pass through system of claim 2, wherein the top plate is secured to the bottom plate using a fastener.

4. The modular cabinet cable pass through system of claim 1, wherein the bottom plate is provided in an opening in an equipment cabinet.

5. The modular cabinet cable pass through system of claim 1, wherein the top plate portion and/or the bottom plate portion comprises scallops on a surface thereon.

6. The modular cabinet cable pass through system of claim 5, wherein the scallops comprise a convex portion on a first surface and a concave portion on a second surface.

7. The modular cabinet cable pass through system of claim 5, wherein ends of the first top modular plate leg and the first bottom modular plate leg are configured to interface with one of the scalloped surfaces.

8. The modular cabinet cable pass through system of claim 1, wherein a size of the opening is adjustable by moving the top modular top plate and the bottom modular plate relative to each other.

9. The modular cabinet cable pass through system of claim 1, further comprising:
    a flow restrictor positioned in the opening.

10. A method for providing a modular cabinet cable pass through, comprising:
    positioning, on a bottom plate of a cabinet, a bottom modular plate having a U-shape and having a first bottom modular plate leg, a second bottom modular plate leg, and a bottom plate portion therebetween, the second bottom modular plate leg being longer than the first bottom modular plate leg;
    positioning a first top modular plate leg of a top modular plate having a U-shape on the bottom plate portion of the bottom modular plate, and portions of a second top modular plate leg on the bottom plate of the cabinet, wherein the second top modular plate leg is longer than the first top modular plate leg, and the top modular plate has a top plate portion between the first top modular plate leg and the second top modular plate leg; and
    adjusting a position of the top modular plate or the bottom modular plate to define an opening between the top modular plate or the bottom modular plate and the bottom plate of the cabinet;

wherein the opening is sized to receive a cable passing through the cabinet.

11. The method of claim 10, further comprising:

positioning a top plate over at least a portion of the top modular plate.

12. The method of claim 11, wherein the top plate is secured to the bottom plate using a fastener.

13. The method of claim 10, wherein the bottom plate is provided in an opening in an equipment cabinet.

14. The method of claim 10, wherein the top plate portion and/or the bottom plate portion comprises scallops on a surface thereon.

15. The method of claim 14, wherein the scallops comprise a convex portion on a first surface and a concave portion on a second surface.

16. The method of claim 14, wherein ends of the first top modular plate leg and the first bottom modular plate leg are configured to interface with one of the scalloped surfaces.

17. The method of claim 14, wherein a size of the opening is adjustable by moving the top modular top plate and the bottom modular plate relative to each other.

18. The method of claim 10, further comprising:

positioning a flow restrictor in the opening.

* * * * *